US011236435B2

(12) United States Patent
Miyamoto

(10) Patent No.: US 11,236,435 B2
(45) Date of Patent: Feb. 1, 2022

(54) METHOD FOR HOLDING SUBSTRATE ON SUBSTRATE HOLDER

(71) Applicant: EBARA CORPORATION, Tokyo (JP)

(72) Inventor: Matsutaro Miyamoto, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 226 days.

(21) Appl. No.: 16/596,788

(22) Filed: Oct. 9, 2019

(65) Prior Publication Data

US 2020/0157701 A1 May 21, 2020

(30) Foreign Application Priority Data

Nov. 21, 2018 (JP) .............................. JP2018-218246

(51) Int. Cl.
*H01L 21/687* (2006.01)
*C25D 17/06* (2006.01)

(52) U.S. Cl.
CPC ........ *C25D 17/06* (2013.01); *H01L 21/68721* (2013.01); *Y10T 29/49998* (2015.01)

(58) Field of Classification Search
CPC .... C25D 17/06; C25D 17/004; C25D 17/001; H01L 21/68721; H01L 21/67057; H01L 21/67017; H01L 21/67126; H01L 21/6715; B29D 12/00
USPC ......................................................... 29/56.6
See application file for complete search history.

(56) References Cited

U.S. PATENT DOCUMENTS

| 6,340,639 B1 * | 1/2002 | Arita ................ H01J 37/32009 438/729 |
| 6,695,687 B2 * | 2/2004 | Hollatz .................. B24B 37/30 451/288 |
| 6,957,998 B2 * | 10/2005 | Togawa ................ B24B 53/017 451/8 |
| 7,108,581 B2 * | 9/2006 | Togawa ................ B24B 53/017 451/8 |
| 7,108,592 B2 * | 9/2006 | Fukaya .................. B24B 37/30 257/E21.23 |
| 7,632,173 B2 * | 12/2009 | Togawa .................. B24B 37/30 451/289 |
| 10,577,713 B2 * | 3/2020 | Miyamoto ............ C25D 17/001 |
| 2002/0132559 A1 * | 9/2002 | Togawa ................ B24B 53/017 451/8 |

(Continued)

FOREIGN PATENT DOCUMENTS

| JP | 2004043936 | 2/2004 |
| JP | 2015187306 | 10/2015 |
| JP | 2018040045 | 3/2018 |

*Primary Examiner* — Lawrence Averick
(74) *Attorney, Agent, or Firm* — JCIPRNET

(57) ABSTRACT

A method for holding a substrate on the substrate holder is provided, and in this method, the substrate holder includes a front frame, a rear frame, a clamper for clamping the front frame and the rear frame; and seals configured to come into contact with the substrate and one of the front frame and the rear frame when the front frame and the rear frame are clamped. The method includes pressing at least one of the front frame and the rear frame toward another one to press the seals against the substrate, and compressing the seals; and clamping the front frame and the rear frame by the clamper in a state that the seals are compressed. During the seals being compressed, a place where a force is applied to at least one of the front frame and the rear frame is a position closer to the clamper than the seals.

4 Claims, 8 Drawing Sheets

(56) References Cited

U.S. PATENT DOCUMENTS

| | | | | |
|---|---|---|---|---|
| 2002/0177394 A1* | 11/2002 | Hollatz | ................... | B24B 37/30 |
| | | | | 451/388 |
| 2004/0020599 A1* | 2/2004 | Tanaka | ................ | C23C 16/4581 |
| | | | | 156/345.29 |
| 2005/0260925 A1* | 11/2005 | Togawa | ................... | B24B 37/30 |
| | | | | 451/8 |
| 2008/0119121 A1* | 5/2008 | Togawa | ................ | B24B 49/105 |
| | | | | 451/288 |
| 2011/0034034 A1* | 2/2011 | Du Bois | ............. | C23C 16/4585 |
| | | | | 438/758 |

\* cited by examiner

METHOD FOR HOLDING SUBSTRATE ON SUBSTRATE HOLDER

CROSS REFERENCE TO RELATED APPLICATIONS

This application claims the priority benefit of Japanese Patent Application No. 2018-218246, filed on Nov. 21, 2018. The entirety of the above-mentioned patent application is hereby incorporated by reference herein and made a part of this specification.

BACKGROUND OF THE DISCLOSURE

Technical Field

The disclosure relates to a method for holding a substrate on a substrate holder.

Related Art

A wiring, a bump (a protruding electrode) or the like is formed on a front surface of a substrate such as a semiconductor wafer or a print substrate. An electrolytic plating method is known as a method for forming the wiring, the bump or the like.

In a plating device using the electrolytic plating method, a substrate holder which seals the vicinity of end portions of a circular or polygonal substrate and exposes a front surface (a plated surface) of the substrate to hold the substrate is used. When a plating treatment is carried out on the front surface of the substrate, the substrate holder which holds the substrate is immersed in a plating solution. Because end surfaces of the substrate are sealed by the substrate holder, the front surface of the substrate is exposed to the plating solution, but a power supply portion of the substrate which is positioned outside the seal is not in contact with the plating solution. For example, known Patent literature may be listed as Japanese Laid-Open No. 2004-43936 (Patent literature 1), Japanese Laid-Open No. 2015-187306 (Patent literature 2) and Japanese Laid-Open No. 2018-40045 (Patent literature 3).

SUMMARY

In a state that the substrate is held by the substrate holder, the vicinity of the end portions of the substrate is sealed. Therefore, in the state that the substrate is held by the substrate holder, a seal member is arranged in a compressed state near the end portions of the substrate. When the substrate is held by the substrate holder, it is necessary to apply a force to the substrate holder to compress the seal member. Although it is necessary to apply a force to the substrate holder when the substrate is held by the substrate holder, from the viewpoint of ease of placement of the substrate onto the substrate holder, a small force is desirable. The disclosure provides a method for locking the substrate holder with a relatively small force.

SUMMARY

According to one embodiment, a method for holding a substrate on a substrate holder is provided, and in this method, the substrate holder includes a front frame, a rear frame, a clamper for clamping the front frame and the rear frame; and seals which come into contact with one of the front frame and the rear frame and the substrate when the front frame and the rear frame are clamped. The method includes: pressing at least one of the front frame and the rear frame to another one, so as to press the seals against the substrate and compress the seals; and clamping the front frame and the rear frame by the clamper in a state that the seals are compressed. During the seals being compressed, a place where a force is applied to at least one of the front frame and the rear frame is a position closer to the clampers than the seals.

DESCRIPTION OF THE EMBODIMENTS

Embodiments of a substrate transfer device and a substrate treatment device including the substrate transfer device according to the disclosure are described below with attached drawings. In the attached drawings, identical or similar reference symbols are labelled to identical or similar elements, and repeated illustrations relating to identical or similar elements may be omitted in description of each embodiment. In addition, features shown in each embodiment are also applicable to other embodiments as long as no contradiction arises.

<Summary of Plating Device>

Figure 1:
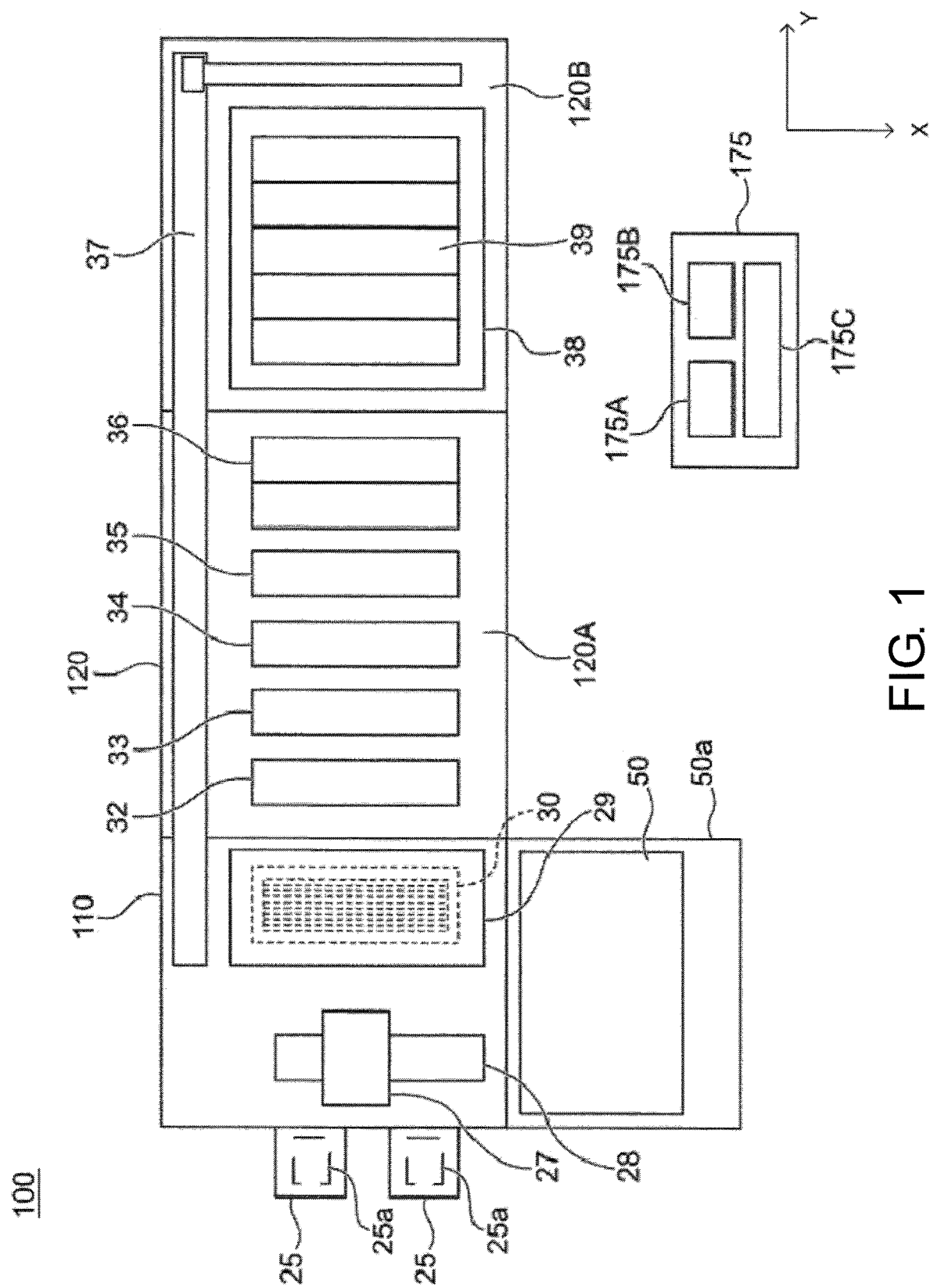
FIG. 1 is an overall arrangement view of a plating device according to one embodiment.

FIG. 1 is an overall arrangement view of a plating device using a substrate holder according to an embodiment. As shown in FIG. 1, the plating device 100 is roughly divided into a load/unload portion 110 which loads a substrate onto the substrate holder 1 (see FIGS. 2A-2C onwards for the symbol "1") or unloads the substrate from the substrate holder 1, a treatment portion 120 which treats the substrate, and a cleaning portion 50a. The treatment portion 120 further includes a pre-treatment and post-treatment portion 120A which carries out pre-treatment and post-treatment of the substrate, and a plating treatment portion 120B which carries out a plating to the substrate. Furthermore, the substrate which is treated by the plating device 100 includes a square substrate and a circular substrate. In addition, the square substrate includes a glass substrate, a liquid crystal substrate and a print substrate having a polygonal shape of rectangle or the like, and other polygonal plating objects. The circular substrate includes a semiconductor wafer, a glass substrate, and other circular plating objects.

The load/unload portion 110 has two cassette tables 25 and a substrate attachment/detachment mechanism 29. A cassette 25a for accommodating the substrate such as the semiconductor wafer, the glass substrate, the liquid crystal substrate, the print substrate or the like is mounted on the cassette tables 25. The substrate attachment/detachment mechanism 29 is configured to attach the substrate to or detach the substrate from the substrate holder 1. In addition, a stocker 30 for housing the substrate holder 1 is arranged near (for example, below) the substrate attachment/detachment mechanism 29. A substrate transfer device 27 including a transfer robot which transfers the substrate between the units 25, 29 and 30 is arranged in the middle of these units 25, 29 and 30. The substrate transfer device 27 is configured to be capable of traveling by a travelling mechanism 28.

The cleaning portion 50a has a cleaning device 50 which cleans and dries the substrate after plating treatment. The substrate transfer device 27 transfers the substrate after plating treatment to the cleaning device 50 and takes the cleaned substrate out from the cleaning device 50.

The pre-treatment and post-treatment portion 120A has a pre-wet tank 32, a pre-soak tank 33, a pre-rinse tank 34, a blow tank 35, and a rinse tank 36. In the pre-wet tank 32, the substrate is immersed in pure water. In the pre-soak tank 33, an oxide film on a front surface of a conductive layer such as a seed layer or the like formed a front surface of substrate is removed by etching. In the pre-rinse tank 34, the substrate after pre-soak is cleaned by a cleaning solution (pure water or the like) together with the substrate holder. In the blow tank 35, the substrate after cleaning is drained. In the rinse tank 36, the substrate after plating is cleaned by the cleaning solution together with the substrate holder. The pre-wet tank 32, the pre-soak tank 33, the pre-rinse tank 34, the blow tank 35, and the rinse tank 36 are arranged in this order. Furthermore, the configuration of the pre-treatment and post-treatment portion 120A of the plating device 100 is an example, and the configuration of the pre-treatment and post-treatment portion 120A of the plating device 100 is not limited, and other configurations may be employed.

The plating treatment portion 120B has a plurality of plating tanks 39 including an overflow tank 38. Each plating tank 39 accommodates one substrate inside and immerses the substrate into a plating solution held inside to carry out plating such as copper plating on the front surface of the substrate. Here, the type of the plating solution is not particularly limited, and various plating solutions can be used depending on usage.

The plating device 100 has a substrate holder transfer device 37 which is positioned on the lateral side of each of these apparatuses and transfers the substrate holder among these apparatuses together with the substrate, the substrate holder transfer device 37 employing, for example, a linear motor approach. The substrate holder transfer device 37 is configured to transfer the substrate holder among the substrate attachment/detachment mechanism 29, the pre-wet tank 32, the pre-soak tank 33, the pre-rinse tank 34, the blow tank 35, the rinse tank 36, and the plating tanks 39.

A plating treatment system including a plurality of the plating devices 100 which are configured as above has a controller 175 configured to control each portion described above. The controller 175 has a memory 175B which stores a predetermined program, a CPU (Central Processing Unit) 175A which executes the program in the memory 175B, and a control portion 175C which is implemented by executing the program by the CPU 175A. The control portion 175C can control, for example, the transfer of the substrate transfer device 27, the attachment of the substrate to or detachment of the substrate from substrate holder in the substrate attachment/detachment mechanism 29, the transfer of the substrate holder transfer device 37, plating current and plating time in each plating tank 39, an opening diameter of an anode mask (not shown) which is arranged in each plating tank 39, an opening diameter of a regulation plate (not shown), and the like. In addition, the controller 175 is configured to be capable of communicating with a host controller which is not shown, and can exchange data with a data base included in the host controller, the host controller integrally controlling the plating device 100 and other related devices. Here, a storage medium which configures the memory 175B stores various setting data or various programs such as a plating treatment program and the like described later. Well-known storages medium such as a memory such as a ROM, a RAM or the like which is readable by a computer, a disk-like storage medium such as a hard disk, a CD-ROM, a DVD-ROM, a flexible disk or the like may be used as the storage medium.

<Substrate Holder 1>

Figure 2A:
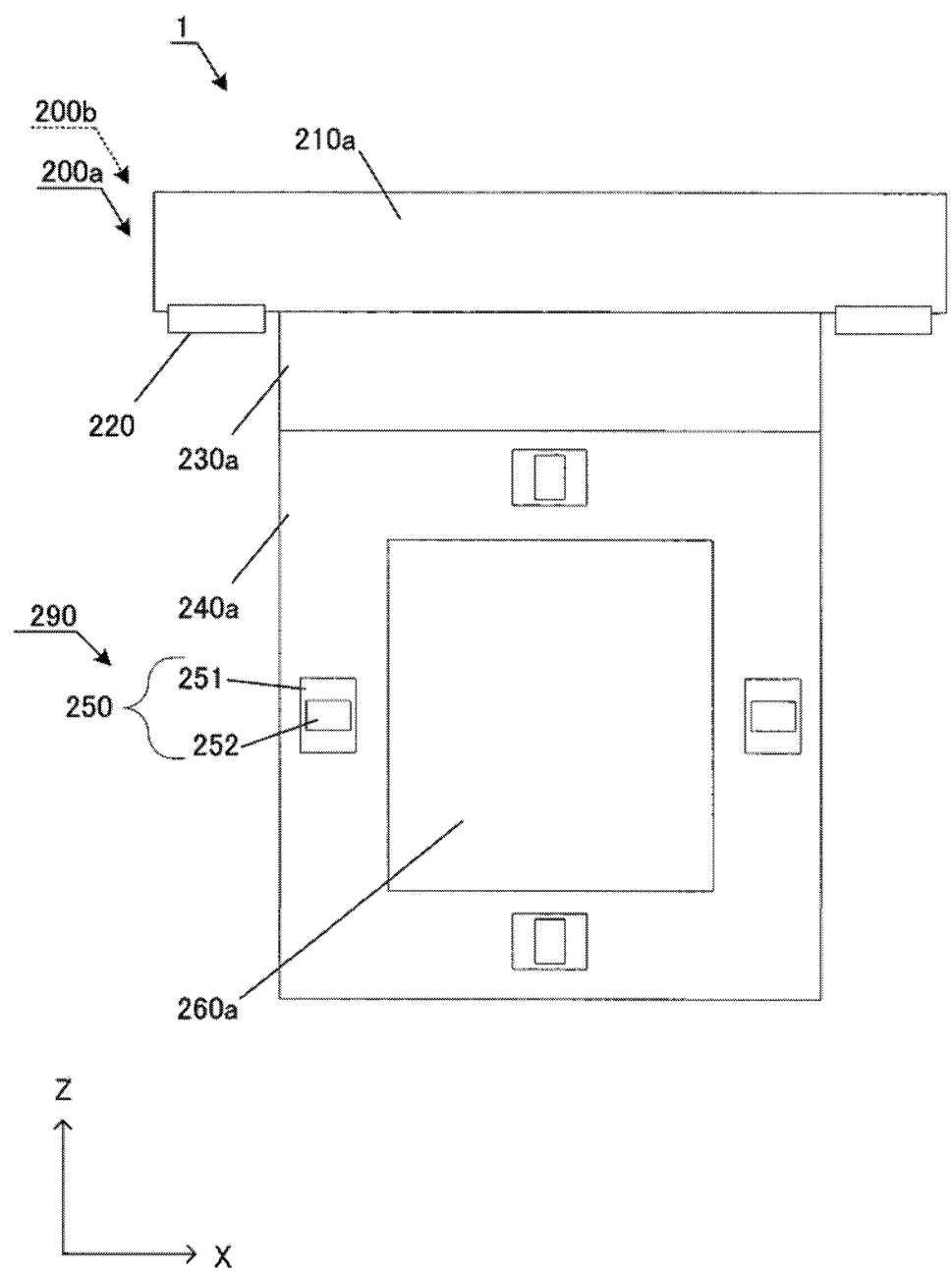
FIG. 2A is a front view schematically showing a substrate holder according to one embodiment.
Figure 2B:
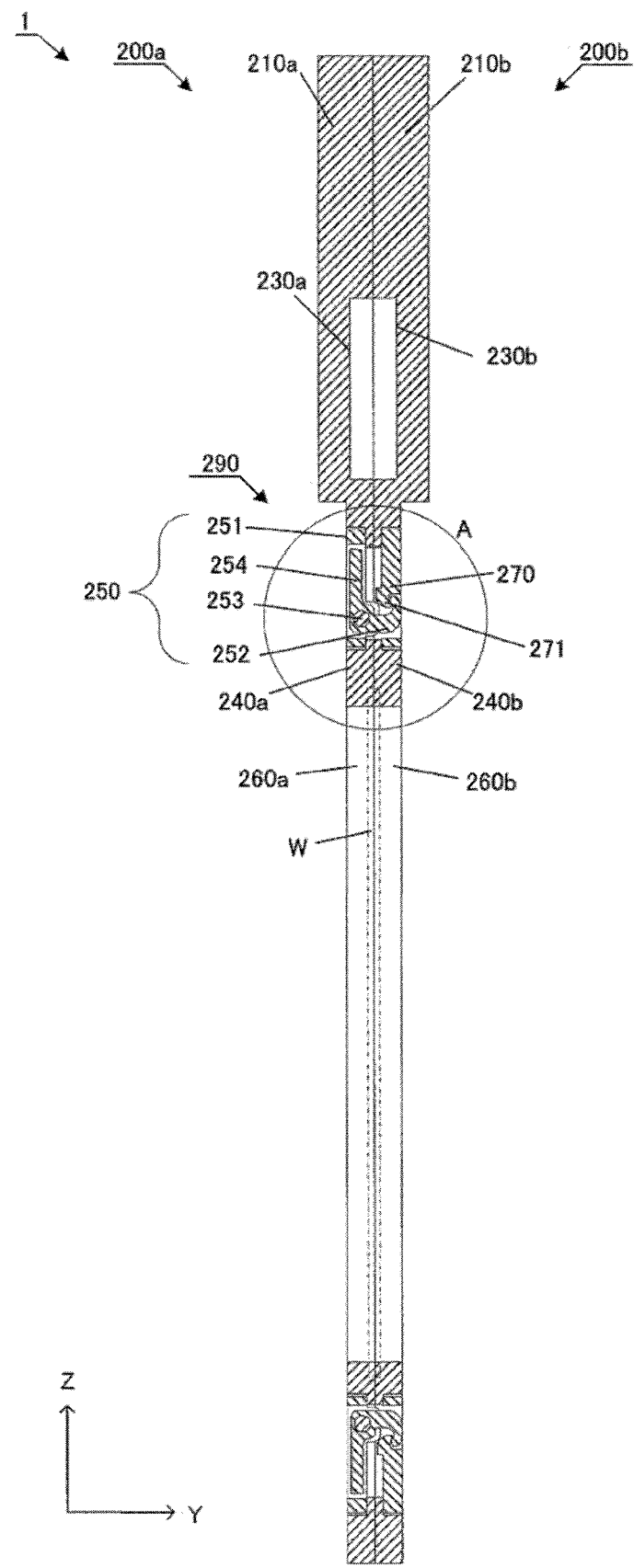
FIG. 2B is a side cross-section view schematically showing the substrate holder according to one embodiment.
Figure 2C:
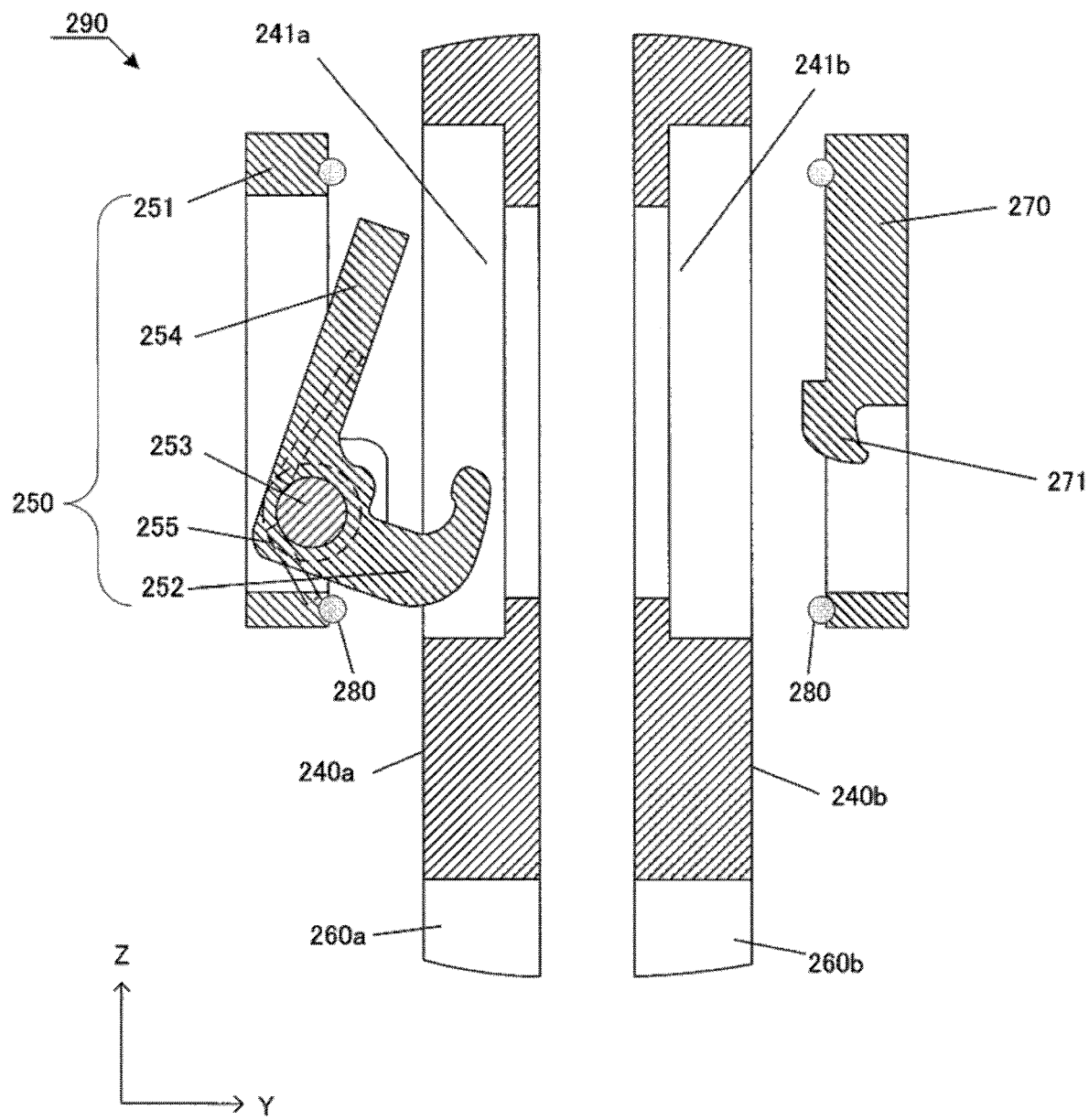
FIG. 2C is an enlarged view of a part marked with a symbol "A" in FIG. 2B.

Next, the substrate holder 1 according to one embodiment is described using FIGS. 2A-2C. FIG. 2A is a front view schematically showing the substrate holder 1 according to one embodiment. FIG. 2B is a side cross-section view schematically showing the substrate holder 1 according to one embodiment. FIG. 2C is an enlarged view of a part marked with a symbol "A" in FIG. 2B. However, FIG. 2C is an exploded view. In the description below, a left-right direction in FIG. 2A (a longitudinal direction of an arm portion 210a described later) is set as the X-direction, a direction perpendicular to the paper (a direction perpendicular to a surface of a substrate W to be held) is set as the Y-direction, and a vertical direction is set as the Z-direction. With regard to the X-direction, a right direction in FIG. 2A is set as the positive direction. With regard to the Y-direction, an inward direction with respect to the paper in FIG. 2A is set as the positive direction. With regard to the Z-direction, an up direction in FIG. 2A is set as the positive direction.

The substrate holder 1 is a member for holding a substrate by clamping the substrate between the frames. The substrate holder 1 includes a front frame 200a and a rear frame 200b. More specifically, at least one portion of the substrate holder 1 is configured by combining the front frame 200a and the rear frame 200b. The front frame 200a and the rear frame 200b are clamped by at least one, or may be clamped by a plurality of clampers 290 (details of the clampers 290 are described later). A dotted line extending from the symbol "200b" in FIG. 2A indicates that the rear frame 200b is not shown in FIG. 2A. The substrate holder 1 is configured to hold the substrate W by clamping the substrate W between the front frame 200a and the rear frame 200b. The substrate W is shown by an imaginary line in FIG. 2B.

The front frame 200a and the rear frame 200b are symmetrical structures except for a hook portion 250 and a plate 270 which are described later. Therefore, the terms "front" and "rear" are for convenience only. In other words, either the side where the front frame 200a is positioned or the side where the rear frame 200b is positioned may be referred as the front. However, the front frame 200a and the rear frame 200b are not required to be designed into symmetrical structures.

The arm portion 210a is arranged above the front frame 200a. Shoulder electrodes 220 may be arranged on shoulders of the arm portion 210a. In the example of FIGS. 2A-2C, two shoulder electrodes 220 are arranged on both shoulders of the arm portion 210a. Furthermore, in FIG. 2A, the numeral is typically labelled to only one shoulder electrode 220. The shoulder electrodes 220 are electrically connected to a substrate electrode described later by a conductive path such as a wiring, a bus bar or the like (not shown). Because the substrate electrode described later is electrically connected to the substrate W, the shoulder electrodes 220 are electrically connected to the substrate W. The plating device 100 supplies a current necessary for a plating process to the substrate W via the shoulder electrodes 220. An arm portion 210b is arranged on the rear frame 200b. The configuration of the arm portion 210b is the same as the configuration of the arm portion 210a.

The front frame 200a includes a wiring storage portion 230a. The wiring storage portion 230a is arranged between the arm portion 210a and a frame body 240a described later. The wiring storage portion 230a has a space for storing the wiring used to electrically connect the shoulder electrode 220 and the substrate W. When the shoulder electrode 220 and the substrate W are electrically connected by a bus bar, the front frame 200a may not include the wiring storage portion 230a. A wiring storage portion 230b is arranged on the rear frame 200b. The configuration of the wiring storage portion 230b is the same as the configuration of the wiring storage portion 230a.

The front frame 200a further includes the frame body 240a. The rear frame 200b further includes a frame body 240b. The frame body 240a and the frame body 240b are members that are substantially plate shape. In the central parts of each of the frame body 240a and the frame body 240b, an opening 260a and an opening 260b for exposing the substrate W to be held are formed respectively. Shapes of the opening 260a and the opening 260b may correspond to the shape of a region to be plated in the substrate W. For example, when the substrate W is square, generally, the region to be plated is also square. Therefore, in the example of FIGS. 2A-2C, the opening 260a and the opening 260b are square. By clamping the substrate W between the frame body 240a and the frame body 240b, the frame body 240a and the frame body 240b cooperate to hold the substrate W. Details of the parts which hold the substrate W are described later using FIG. 3.

One surface of the substrate W which is held is exposed to the outside via the opening 260a arranged in the frame body 240a. Another surface of the substrate W which is held is exposed to the outside via the opening 260b arranged in the frame body 240b. Therefore, when the substrate holder 1 is immersed in the plating solution, both surfaces of the substrate W come into contact with the plating solution. In other words, both surfaces of the substrate W can be plated by using the substrate holder 1 in FIGS. 2A-2B. Furthermore, by adjusting electrical conditions or the like inside the substrate holder 1, the substrate holder 1 in FIGS. 2A-2B can also be used for single-sided plating. In addition, the substrate holder 1 may also be configured to have only one of the opening 260a and the opening 260b (in this case, the substrate holder 1 is a holder for single-sided plating).

In order to clamp the front frame 200a and the rear frame 200b, the substrate holder 1 includes one clamper or a plurality of clampers 290. The clamper 290 has a hook portion 250 mounted on the front frame 200a, more specifically on the frame body 240a; and a plate 270 mounted on the rear frame 200b, more specifically on the frame body 240b. In the example of FIGS. 2A-2C, the clampers 290 are arranged near the opening 260a. More specifically, in the example of FIGS. 2A-2C, the clampers 290 are arranged near the centre of each side of the square opening 260a. Therefore, in the example of FIGS. 2A-2C, totally four clampers 290 are arranged. Furthermore, in FIG. 2A and FIG. 2B, the numeral is typically attached to only one clamper 290.

The hook portion 250 includes a hook base 251 which is mounted to the frame body 240a, a hook body 252, and a shaft 253 which pivotally supports the hook body 252 with respect to the hook base 251. The hook portion 250 may further include a lever 254 for pivoting the hook body 252 around the shaft 253. The hook body 252 extends toward a back side of the substrate holder 1, that is, toward the rear frame 200b. The shaft 253 extends in a surface parallel to the surfaces of the substrate to be held. Specific longitudinal direction of the shaft 253 in the surface parallel to the surfaces of the substrate to be held may be different depending on the clampers 290. At least one of the hook base 251, the hook body 252, the shaft 253 and the lever 254 may be formed of titanium or titanium alloy.

The hook portion 250 may further includes a pressing member 255 which applies a force in a direction (a counter-clockwise direction in the hook portion 250 in FIG. 2C) to maintain the hooking of the hook body 252 to a claw 271 described later. By the pressing member 255 applying a force to the hook body 252 to maintain the hooking of the hook body 252, the hook body 252 can be prevented from coming off from the claw 271. The pressing member 255 may be, for example, a spring, and more specifically a torsion spring. The torsion spring contributes to space saving for the pressing member 255 and other components. Therefore, employing the torsion spring as the pressing member 255 may contribute to reducing a holder thickness. Furthermore, the reason why it may reduce the holder thickness is described later. In addition to spring, the pressing member 255 may be, for example, a member that operates by electromagnetic means.

A port 241a (see FIG. 2C) is arranged in the frame body 240a. The port 241a is arranged for mounting the hook body 252. The port 241a is configured to enable at least the hook body 252 to access at least one portion of the plate 270 described later, and more specifically enable the hook body 252 to access the claw 271 of the plate 270. The hook portion 250 is mounted to the port 241a by a fixing member such as a bolt or the like. In order to make the holder as thin as possible, the substrate holder 1 (particularly, the hook portion 250 and the port 241a of the substrate holder 1) may be configured in a manner that the hook portion 250 does not protrude from the frame body 240a, in other words, the hook portion 250 is buried in the frame body 240a. In addition, since the hook portion 250 does not protrude from the frame body 240a, an amount of the plating solution remaining on the substrate holder 1 when the substrate holder 1 is pulled up from the plating solution can be reduced. In addition, since the hook portion 250 does not protrude from the frame body 240a, interference between the hook portion 250 and components of the plating tank can be avoided.

A port 241b (see FIG. 2C) is arranged in the frame body 240b. The position and the number of the port 241b correspond to the position and the number of the port 241a. The plate 270 is mounted to the port 241b by a fixing member such as a bolt or the like. The claw 271 which hooks the hook body 252 by the pivoting of the hook body 252 is arranged on the plate 270. The claw 271 extends toward the front frame 200a. The frame body 240a is fixed with respect to the frame body 240b by hooking the hook body 252 to the claw 271. When the hook body 252 is hooked to the claw 271, if the substrate W is appropriately arranged between the frame body 240a and the frame body 240b, the substrate W is held by the substrate holder 1. In order to make the holder as thin as possible, the plate 270 and the port 241b may be configured in a manner that the plate 270 does not protrude from the frame body 240b, in other words, the plate 270 is buried in the frame body 240b. In addition, since the plate 270 does not protrude from the frame body 240b, the amount of the plating solution remaining on the substrate holder 1 when the substrate holder 1 is pulled up from the plating solution can be reduced. In addition, since the plate 270 does not protrude from the frame body 240b, interference between the plate 270 and the components of the plating tank can be avoided. The hook body 252 which extends toward the rear frame 200b may be also configured to not protrude from the frame body 240b.

As described above, in the embodiment, both the hook portion 250 and the plate 270 are configured not to protrude from each frame, that is, both the hook portion 250 and the plate 270 are buried in each frame. In the specification, this situation is expressed as "the clamper 290 is buried in the front frame 200a and the rear frame 200b".

An elastic support member 280 may be arranged between the hook base 251 and the frame body 240a. The elastic support member 280 is a member for elastically supporting the members and may also be called a "floating member". It should be noted that the "floating" here does not mean "electrical floating" (however, the case that electrical floating is achieved by the elastic support member 280 is not excluded). The elastic support member 280 in the example of FIGS. 2A-2C is an O-ring. Furthermore, in FIG. 2C, illustration of a groove for mounting the O-ring is omitted. Besides the O-ring, an elastic body such as a spring or the like can also be used as the elastic support member 280. The elastic support member 280 may also be arranged between the plate 270 and the frame body 240b.

In the substrate holder for plating the substrate W, at least the thicknesses of the parts immersed in the plating solution are as thin as possible. The main reason is the following two points. Firstly, if the holder thickness is large, as a result, a width of the plating tank becomes large, and the device increases in size. Particularly, when the substrate holder 1 is a holder for two-surface plating, influence on size increasing of the device is remarkable. Secondly, if the holder thickness is large, stirring of the plating solution near the substrate W tends to be insufficient. In addition, there is no protrusion on the parts of the substrate holder 1 immersed in the plating solution. The reason is that the protrusion may define the thickness of the substrate holder 1.

In the configuration of FIGS. 2A-2C, the hook body 252 extends toward one of the front frame 200a and the rear frame 200b to which the hook portion 250 is not mounted. Besides, in the configuration of FIGS. 2A-2C, the claw 271 extends toward one of the front frame 200a and the rear frame 200b to which the plate 270 is not mounted. Therefore, in the configuration in FIGS. 2A-2C, lengths by which the hook body 252, the claw 271 and the like protrude from the front frame 200a and the rear frame 200b are made to zero, or at least can be reduced. In other words, by configuring the substrate holder 1 in the manner shown in FIGS. 2A-2C, the thicknesses of the parts immersed in the plating solution (the frame body 240a, the hook portion 250, the frame body 240b and the plate 270) can be reduced. In addition, there is an advantage that the hook portion 250 and the plate 270 in FIGS. 2A-2B respectively do not protrude from the frame body 240a and the frame body 240b.

In the embodiment shown in FIGS. 2A-2C, the lever 254 or the like may configured in a manner that the hook body 252 is removed from the claw 271 by pulling the lever 254 forward, in place of a manner that the hook body 252 is removed from the claw 271 by pushing the lever 254 backward, that is, toward the frame body 240b. However, the configuration and the control for pulling the lever 254 may be complicated with respect to the structure and the control for pushing the lever 254. Therefore, the lever 254 or the like is configured in the manner that the hook body 252 is removed from the claw 271 by pushing the lever 254 backward, as shown in FIG. 2C.

In the embodiment shown in FIGS. 2A-2C, the hook portion 250 is mounted to the front frame 200a, and the plate 270 is mounted to the rear frame 200b. Alternatively, the hook portion 250 may be mounted to the rear frame 200b, and the plate 270 may be mounted to the front frame 200a. In other words, a certain hook portion 250 is mounted to one of the front frame 200a and the rear frame 200b, and a plate 270 corresponding to this hook portion 250 is mounted to another one of the front frame 200a and the rear frame 200b. Besides, when the substrate holder 1 has a plurality of clampers 290, the hook portion 250 may be arranged on both of the front frame 200a and the rear frame 200b. In this case, corresponding to the arrangement of the hook portion 250, the plate 270 may also be arranged on both of the front frame 200a and the rear frame 200b. From the viewpoint of simplicity in pivoting the hook body 252, either the hook portion 250 or the plate 270 is arranged on the front frame 200a, and another of the hook portion 250 and the plate 270 is arranged on the rear frame 200b.

<Details of Parts that Hold Substrate W>

Figure 3:
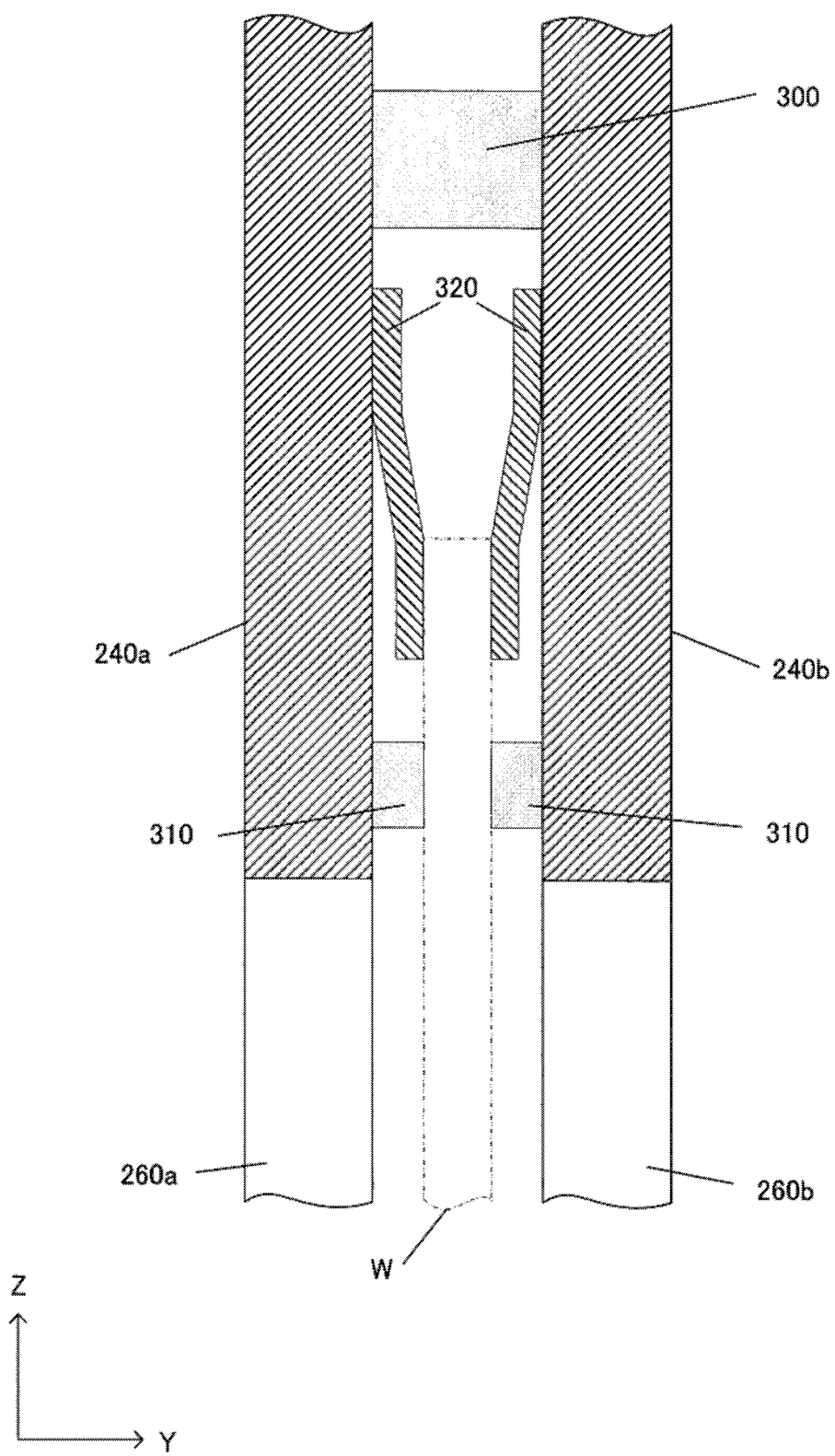
FIG. 3 is a side cross-section view of parts of the substrate holder which hold the substrate.

Next, details of the parts of the substrate holder 1 which hold the substrate W are described using FIG. 3. FIG. 3 is a side cross-section view of the parts of the substrate holder 1 which hold the substrate W. Because the substrate holder 1 is a holder for plating both surfaces of the substrate W, the substrate holder 1 needs to supply electric power to both surfaces of the substrate W. Thus, substrate electrodes 320 are respectively arranged on the frame body 240a and the frame body 240b in FIG. 3. The substrate electrode 320 arranged on the frame body 240a is electrically connected to a front surface (a surface facing the front) of the substrate W, and the substrate electrode 320 arranged on the frame body 240b is electrically connected to a back surface of the substrate W. However, a configuration other than the configuration shown in FIG. 3 can also be employed. An example of other configurations may be a configuration in which the substrate electrode 320 is arranged on only one of the frame body 240a and the frame body 240b, and this substrate electrode 320 is in contact with both surfaces of the substrate W. The substrate electrodes 320 are electrically connected to the shoulder electrodes 220 by means, such as a wiring, a bus bar or the like (not shown). Therefore, the electric power supplied to the shoulder electrodes 220 is supplied to the substrate W via the substrate electrodes 320. At this time, a correspondence relationship between the shoulder electrodes 220 and the substrate electrodes 320 may be configured so that electric power can be independently supplied to the front surface and the back surface of the substrate in a manner that in the left and right shoulder electrodes 220 in FIG. 2A, for example, the shoulder electrode 220 on the left supplies electric power to the substrate electrode 320 of the frame body 240a which corresponds to the front surface of the substrate W, and the shoulder electrode 220 on the right supplies electric power to the substrate electrode 320 of the frame body 240b which corresponds to the back surface of the substrate W.

As described above, electric power is supplied to the substrate electrodes 320. Therefore, the substrate holder 1 is required to be configured in a manner that even when the substrate holder 1 is immersed in the plating solution, the plating solution does not come into contact with the substrate electrodes 320. Therefore, the substrate holder 1 includes an outer seal 300 and inner seals 310 for sealing spaces existing in the substrate electrodes 320. The inner seals 310 may be referred to as "first seal members" and the outer seal 300 may be referred to as "second seal member". The outer seal 300 is configured to seal a gap between the frame body 240a and the frame body 240b outside the substrate W. The outer seal 300 may be arranged on the frame body 240a or be arranged on the frame body 240b. In other words, the substrate holder 1 may include an outer seal 300 which is mounted to one of the front frame 200a and the rear frame 200b and comes into contact with another one of the front frame 200a and the rear frame 200b. On the other hand, the inner seals 310 are respectively arranged on the frame body 240a and the frame body 240bo. The inner seals 310 come into contact with the substrate W when the substrate W is held. That is, the inner seal 310 arranged on the frame body 240a is configured to seal a gap between the frame body 240a and the substrate W. The inner seal 310 arranged on the frame body 240b is configured to seal a gap between the frame body 240b and the substrate W. The outer seal 300 and the inner seals 310 are elastically deformable in a thickness direction of the substrate W (a direction perpendicular to the surface of the substrate W). The substrate W is held between the frame body 240a and the frame body 240b by contact pressures between the inner seals 310 and the substrate W. Furthermore, it should be noted that FIG. 3 is merely a schematic diagram and may differ from the actual configuration. For example, the outer seal 300 and the inner seals 310 may be held by respective seal holders. For example, the inner seals 310 may be arranged on either the front frame 200a or the rear frame 200b.

<Method for Holding Substrate by Substrate Holder>

Figure 4:
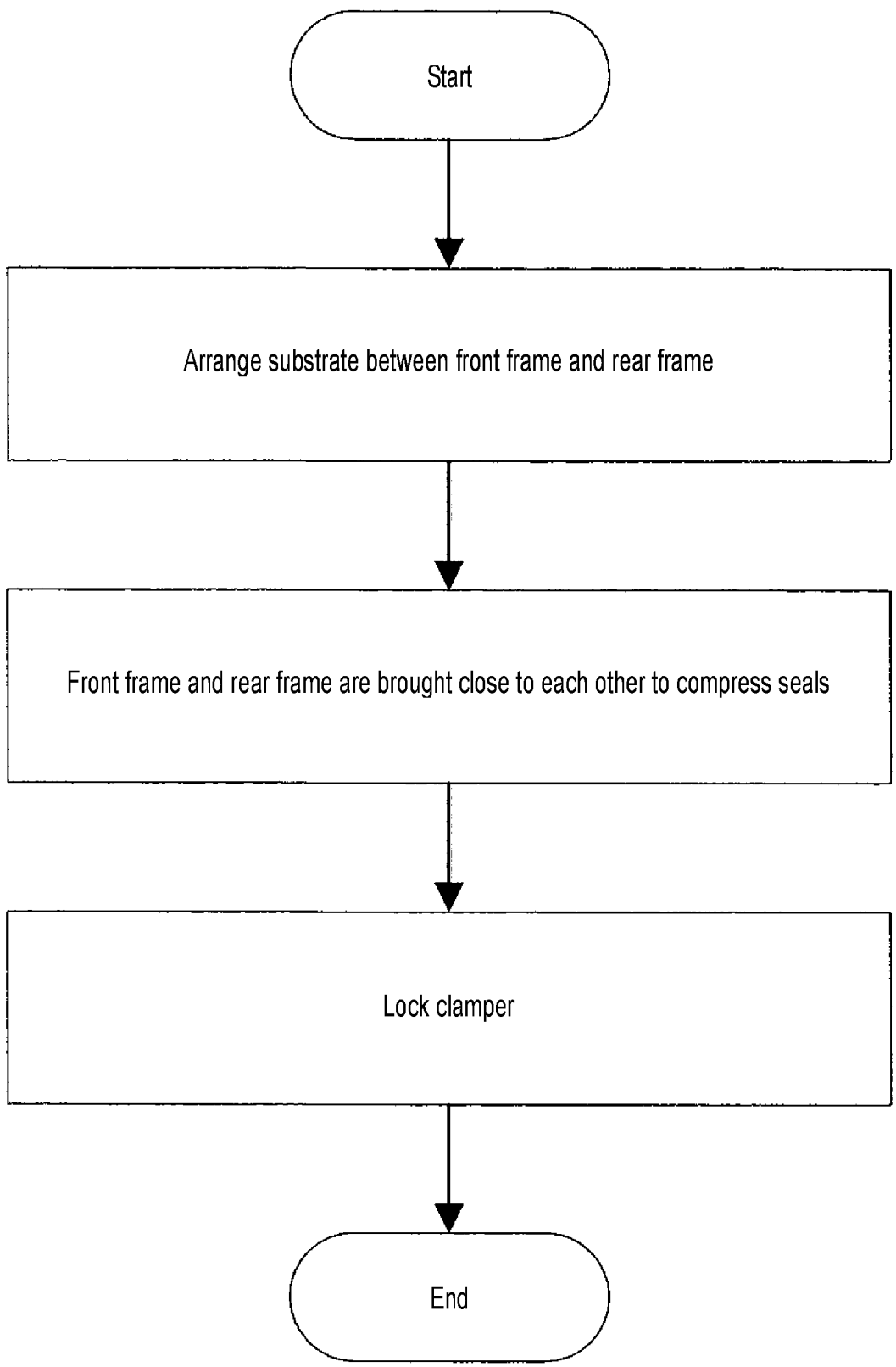
FIG. 4 is a flow chart showing a process according to one embodiment in which the substrate is held by the substrate holder.
Figure 5:
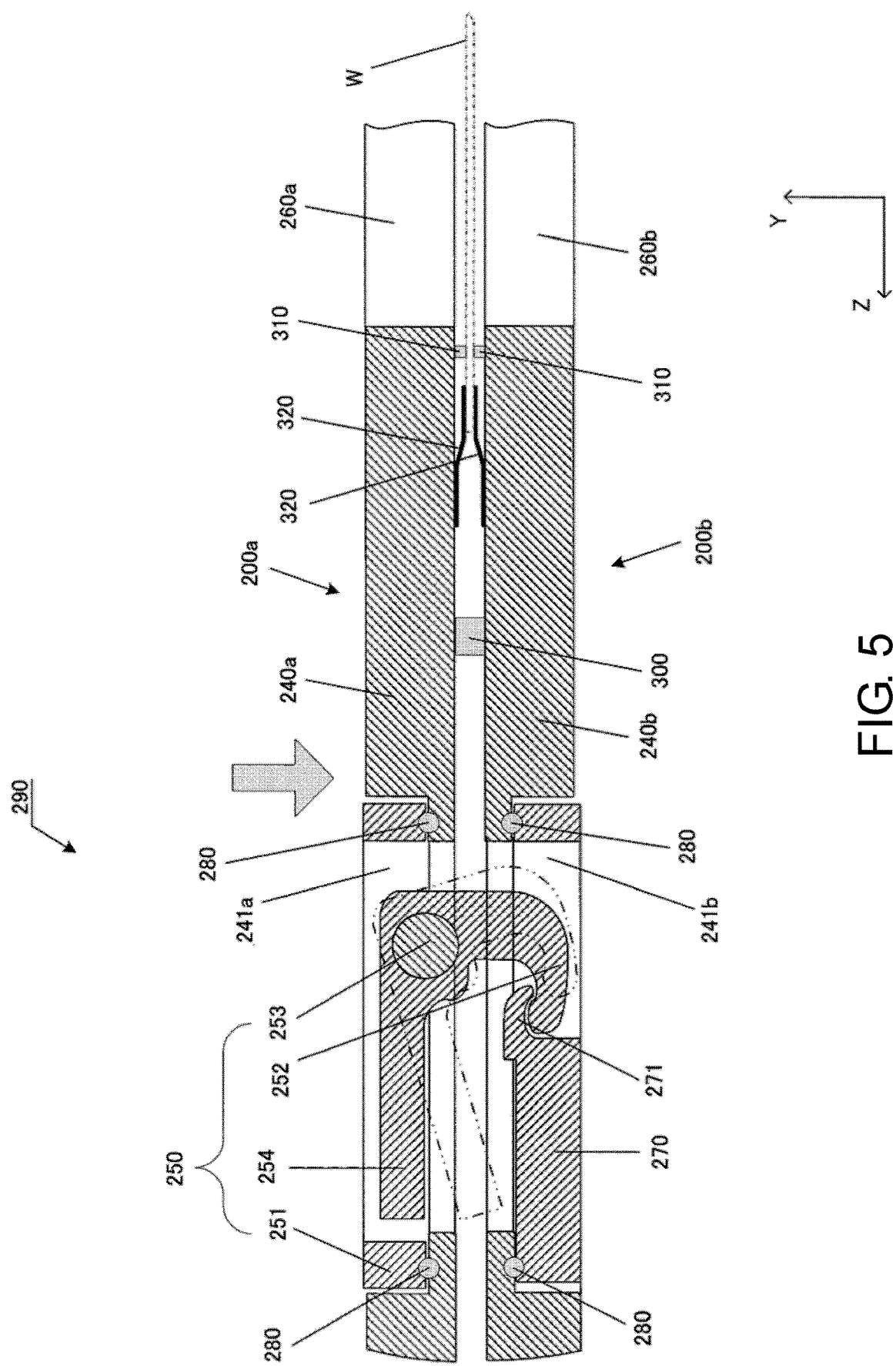
FIG. 5 is a cross-section view for illustrating a process according to one embodiment in which the substrate is held by the substrate holder.

FIG. 4 is a flow chart showing a process according to one embodiment in which the substrate is held by the substrate holder. FIG. 5 is a cross-section view for describing the process according to one embodiment in which the substrate is held by the substrate holder. FIG. 5 generally corresponds to the part marked with the symbol "A" in FIG. 2B. Arrangement of the substrate onto the substrate holder may be automatically carried out using a robot or the like, or be carried out manually.

In order to arrange the substrate W on the substrate holder 1, first, the front frame 200a and the rear frame 200b are separated. Then, the substrate W is arranged in a predetermined position between the front frame 200a and the rear frame 200b. If the substrate W is arranged in the predetermined position, the front frame 200a and the rear frame 200b are brought close to each other. At this time, the lever 254 is pushed to the frame body 240b so that the hook body 252 does not collide with the claw 271. When the front frame 200a and the rear frame 200b get close to each other, the inner seals 310 come into contact with the substrate W, and the outer seal 300 come into contact with the frame body 240a and the frame body 240b. Next, the frame body 240a is pressed toward the frame body 240b to compress the outer seal 300 and the inner seals 310. At this time, a place in which a force is applied to the frame body 240a is desirably close to the clampers 290 as shown by an arrow in FIG. 5. As one example, the place in which the force is applied may be a position closer to engagement portions of the clampers 290 than the inner seals 310 when viewed in the vertical direction (the z-direction). In addition, the place in which the force is applied may also be the hook base 251. In addition, as one example, when the inner seals 310, the outer seal 300, and the clampers 290 are arranged in order from an inner side (a substrate side) as shown in FIG. 5, the place in which the force is applied may be outside the outer seal 300.

When the clamper 290 is locked, it is necessary to press the frame body 240a to the frame body 240b against reaction forces generated from the outer seal 300, the inner seals 310 and the like. At this time, if the entire frame body 240a is pressed to the frame body 240b, a strong force is required, and thus the clamper 290 can be locked with a relatively small force by applying the force only near the clamper 290. Particularly, in recent years, because a substrate which is treated regardless of the shape of the substrate such as square, circular or the like increase in size, and the required force for compressing seals is growing, it is important to reduce the force for locking the clamper 290.

Figure 6:
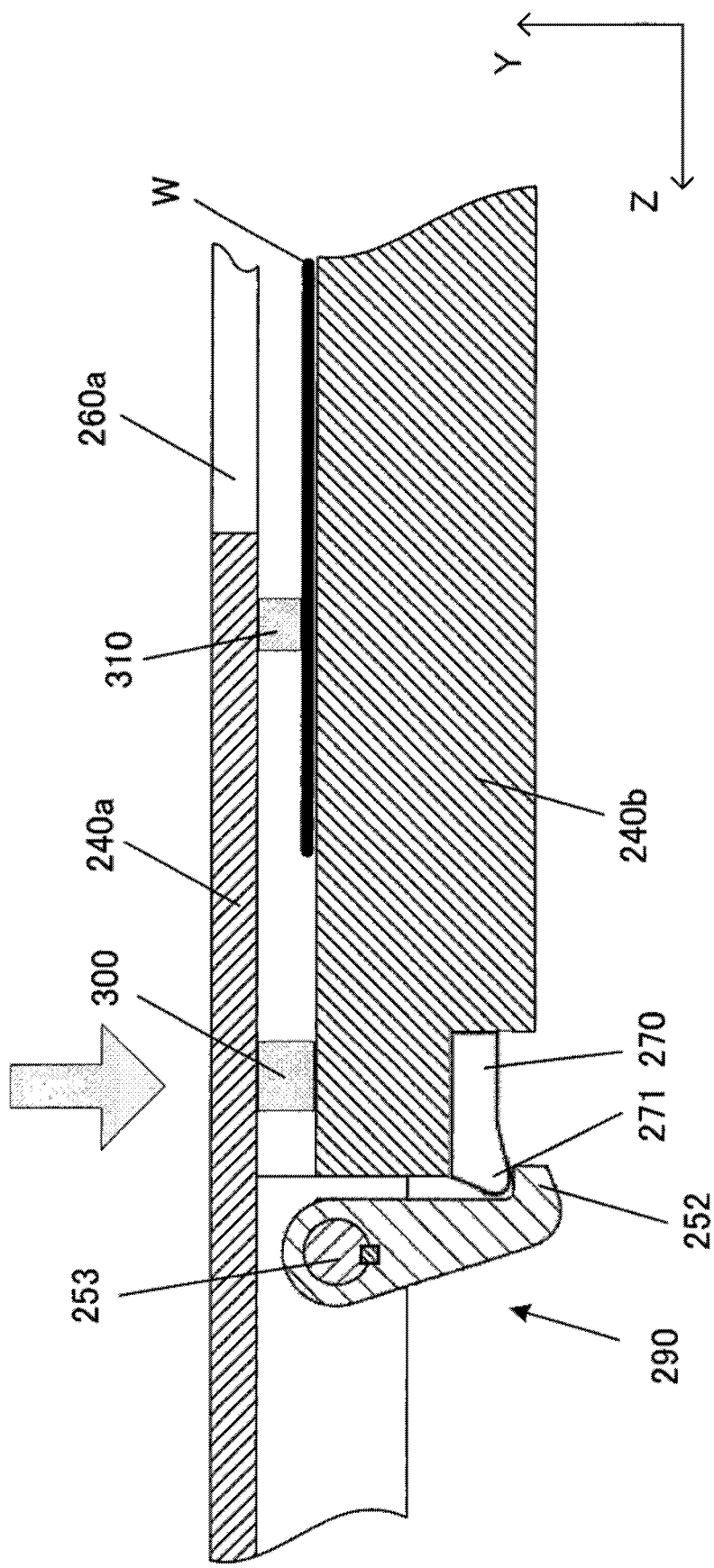
FIG. 6 is a cross-section view for illustrating a process according to one embodiment in which the substrate is held by the substrate holder.

FIG. 6 is a cross-section view for illustrating a process according to one embodiment in which the substrate is held by the substrate holder. The substrate holder 1 according to the embodiment shown in FIG. 6 is a substrate holder for single-sided plating. In the embodiment shown in FIG. 6, the frame body 240a of the substrate holder 1 includes an opening 260a, but the frame body 240b does not include an opening. In addition, the substrate holder 1 shown in FIG. 6 has clampers 290 having hook portions 250 similar to those of FIG. 5 although the shape and arrangement are different. In the substrate holder 1 shown in FIG. 6, the substrate W can be held on the substrate holder 1 by the method described in conjunction with FIGS. 4 and 5.

At least technical ideas below can be understood from the above-described embodiments.

[Aspect 1] According to aspect 1, a method for holding a substrate on the substrate holder is provided, and in this method, the substrate holder includes: a front frame, a rear frame, a clamper for clamping the front frame and the rear frame; and seals which come into contact with the substrate and one of the front frame and the rear frame when the front frame and the rear frame are clamped. The method includes pressing at least one of the front frame and the rear frame to another one, so as to press the seals against the substrate and compress the seals; and clamping the front frame and the rear frame by the clamper in the state that the seals are compressed. During the seals being compressed, a place where a force is applied to at least one of the front frame and the rear frame is a position closer to the clamper than the seals.

[Aspect 2] According to aspect 2, in the method of aspect 1, the substrate holder further includes an outer seal arranged between the front frame and the rear frame; the seals, the outer seal, and the clamper are arranged outward in order when viewed from a centre of the substrate which is held by the substrate holder, and the place where a force is applied is outside the outer seal.

[Aspect 3] According to aspect 3, in the method of aspect 1 or 2, the substrate holder is configured to hold a square substrate.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method for holding a substrate on a substrate holder, wherein the substrate holder comprises:
a front frame,
a rear frame,
a clamper for clamping the front frame and the rear frame, and seals configured to come into contact with the substrate and one of the front frame and the rear frame when the front frame and the rear frame are clamped;

the method comprising:

pressing at least one of the front frame and the rear frame toward another one, so as to press the seals against the substrate and compress the seals; and clamping the front frame and the rear frame by the clamper in a state that the seals are compressed, wherein during the seals being compressed, a place where a force is applied to at least one of the front frame and the rear frame is a position closer to the clamper than the seals.

2. The method according to claim 1, wherein the substrate holder further comprises an outer seal which is arranged between the front frame and the rear frame;

the seals, the outer seal, and the clamper are arranged outward in order when viewed from a center of the substrate which is held by the substrate holder, and the place where the force is applied is outside the outer seal.

3. The method according to claim 1, wherein the substrate holder is configured to hold a square substrate.

4. The method according to claim 2, wherein the substrate holder is configured to hold a square substrate.

* * * * *